United States Patent
Rusch et al.

(10) Patent No.: US 7,230,877 B1
(45) Date of Patent: Jun. 12, 2007

(54) METHOD OF MAKING A SEMICONDUCTOR MEMORY DEVICE

(75) Inventors: Andreas Rusch, Dresden (DE); Steffen Rothenhäusser, Dresden (DE); Alexander Truby, Dresden (DE); Yoichi Otani, Weixdorf (DE); Ulrich Zimmermann, Mechanicsville, VA (US)

(73) Assignee: Infineon Technologies AG, Munich (DE)

( * ) Notice: Subject to any disclaimer, the term of this patent is extended or adjusted under 35 U.S.C. 154(b) by 1050 days.

(21) Appl. No.: 09/685,361

(22) Filed: Oct. 10, 2000

(Under 37 CFR 1.47)

Related U.S. Application Data

(63) Continuation of application No. PCT/DE99/00901, filed on Mar. 25, 1999.

(30) Foreign Application Priority Data

Apr. 8, 1998 (DE) ......................................... 198 15 874

(51) Int. Cl.
*H01L 21/8234* (2006.01)

(52) U.S. Cl. ...................... 365/275; 438/276; 438/277; 438/278

(58) Field of Classification Search .......... 438/275–278
See application file for complete search history.

(56) References Cited

U.S. PATENT DOCUMENTS

| | | | |
|---|---|---|---|
| 5,170,227 A | 12/1992 | Kaneko et al. | |
| 5,563,098 A | 10/1996 | Kuo et al. | |
| 5,620,926 A | 4/1997 | Itoh | |
| 5,621,247 A | 4/1997 | Hirao et al. | |
| 5,753,553 A * | 5/1998 | Hikawa et al. | 438/278 |
| 5,960,283 A * | 9/1999 | Sato | 438/257 |
| 6,030,871 A * | 2/2000 | Eitan | 438/276 |
| 6,200,861 B1 * | 3/2001 | Wu et al. | 438/278 |
| 6,201,282 B1 * | 3/2001 | Eitan | 257/390 |
| 6,221,723 B1 * | 4/2001 | Kunitou | 438/276 |

FOREIGN PATENT DOCUMENTS

| | | |
|---|---|---|
| DE | 40 08 883 A1 | 9/1990 |
| JP | 59 067 666 A | 4/1984 |

* cited by examiner

*Primary Examiner*—John F. Niebling
*Assistant Examiner*—Lynne Gurley
(74) *Attorney, Agent, or Firm*—Laurence A. Greenberg; Werner H. Stemer; Ralph E. Locher

(57) ABSTRACT

A method for fabricating a semiconductor memory device is described. An insulating layer is disposed on a semiconductor substrate. A matrix of semiconductor memory elements is disposed in the substrate. The semiconductor memory elements include a plurality of contact holes formed in the insulating layer. One contact hole is formed in the insulating layer for each of the semiconductor memory elements. A bit definition region is disposed in the semiconductor substrate underneath each of the contact holes. A contact plug is disposed in each of the contact holes and is in electrical contact with the bit definition region. The bit definition region is configured such that a contact resistance between the semiconductor substrate and the contact plug defines a bit to be stored in the semiconductor memory elements, An evaluation circuit is connected to and evaluates the contact resistance of the semiconductor memory elements.

1 Claim, 2 Drawing Sheets

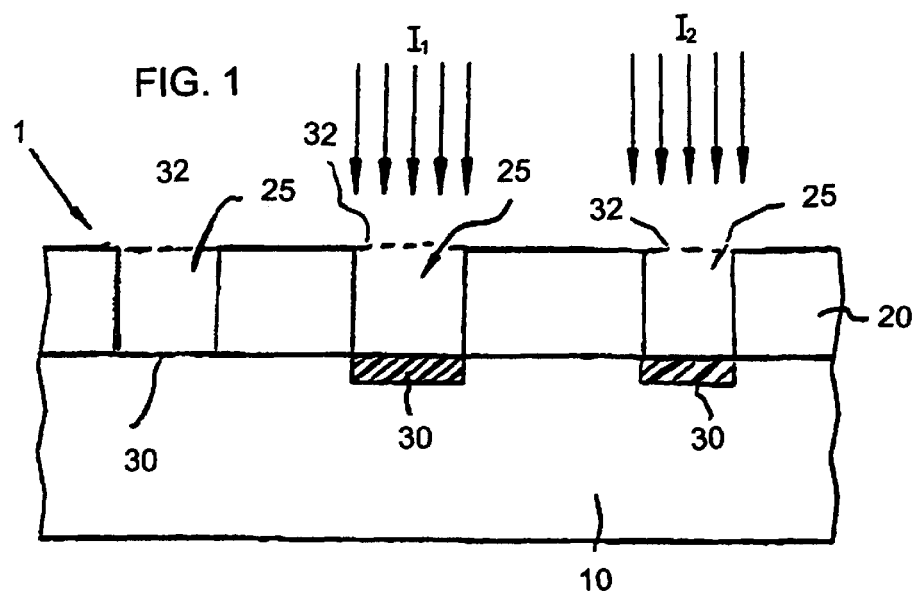
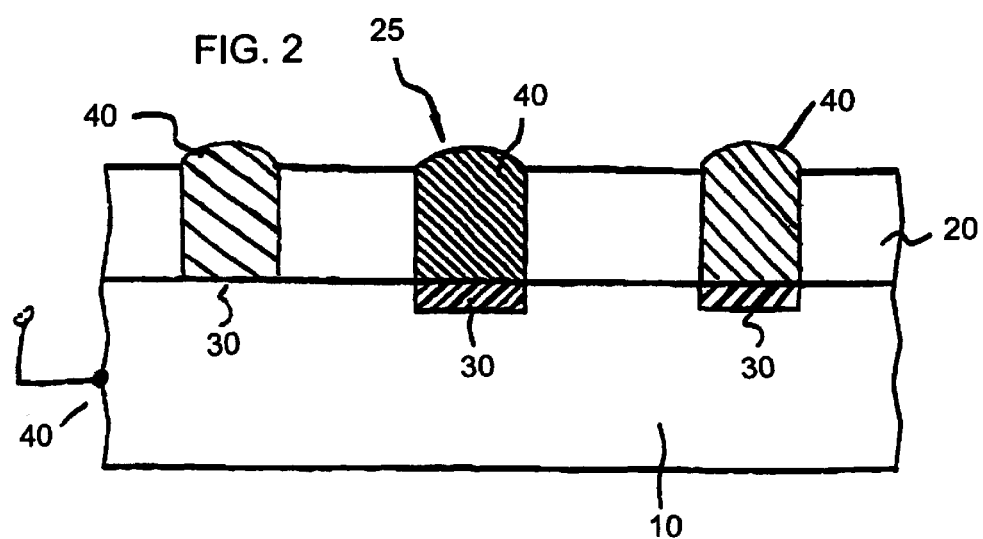

METHOD OF MAKING A SEMICONDUCTOR MEMORY DEVICE

CROSS-REFERENCE TO RELATED APPLICATION

This is a continuation of copending International Application PCT/DE99/00901, filed Mar. 25, 1999, which designated the United States.

BACKGROUND OF THE INVENTION

1. Field of the Invention

The present invention relates to a semiconductor memory device and a method for fabricating it.

Although applicable, in principle, to any semiconductor memory devices, the present invention and the problems on which it is based will be explained with regard to ROM memories or read-only memories using silicon technology.

Known ROM semiconductor memory devices of this type use horizontal or vertical MOSFETs as semiconductor memory cells. A customary method for programming such ROM memories consists in modifying threshold voltages of the MOSFETs used in a ROM cell array in accordance with the desired ROM contents by suitably masked vertical channel implantations. In other words, at least two types of MOSFETs are produced, a first type having a first threshold voltage (e.g. without channel implantation) and a second type having a second threshold voltage (e.g. with channel implantation). One type is assigned the logic "1" and the other type the logic "0". Programmed in this way, each transistor can store a single bit.

It is a constant aim in memory development to increase the storage density, that is to say the number of bits that can be stored per unit area or unit volume. One approach in this direction is the continual miniaturization of the structures involved, for example through read only memories (ROM) memories having folded trench structures.

A further approach is in modifying the semiconductor memory elements in such a way that they can each store more than one bit. This can be achieved for example by performing more than one type of channel implantation, with the result that one bit can be stored per memory cell for each channel implantation.

By way of example, four different threshold voltages, that is to say 2 bits per memory cell, can be generated by four different channel implantations. The different threshold voltages can be distinguished by use of a suitable read-out circuit.

2. Summary of the Invention

It is accordingly an object of the invention to provide a semiconductor memory device and a method for fabricating it that overcomes the above-mentioned disadvantages of the prior art methods and devices of this general type, whose semiconductor memory elements can store more than one bit.

With the foregoing and other objects in view there is provided, in accordance with the invention, a semiconductor memory device formed of a semiconductor substrate having a first conductivity type and a surface. An insulating layer is disposed on the semiconductor substrate. A matrix of semiconductor memory elements is disposed in the substrate. The semiconductor memory elements include a plurality of contact holes formed in the insulating layer. One contact hole is formed in the insulating layer for each of the semiconductor memory elements. A bit definition region is disposed in the semiconductor substrate underneath each of the contact holes. A contact plug is disposed in each of the contact holes and is in electrical contact with the bit definition region. The bit definition region is configured such that a contact resistance between the semiconductor substrate and the contact plug defines a bit to be stored in a respective one of the semiconductor memory elements. The bit definition region in a first group of the semiconductor memory elements is a first implantation region disposed at the surface of the semiconductor substrate and has a dopant of the first conductivity type for decreasing the contact resistance. The bit definition region in a second group of the semiconductor memory elements is a second implantation region disposed at the surface of the semiconductor substrate and has a dopant of a second conductivity type for increasing the contact resistance. The bit definition region in a third group of the semiconductor memory elements corresponds to the semiconductor substrate. A further contact region is disposed in the semiconductor substrate outside of the bit definition region. An evaluation circuit is connected to and evaluates the contact resistance of the semiconductor memory elements.

The idea underlying the invention consists in configuring the respective bit definition region in such a way that it defines the contact resistance between the substrate region and the contact plug region in accordance with the bit to be stored in the respective semiconductor memory element. In other words, the contact hole implantation mask is used for programming, the contact holes being provided with a varying contact resistance. The different resistances can then be assessed during read-out by a suitable evaluation circuit.

The semiconductor memory device according to the invention and the method for fabricating it according to the invention have the following advantages, inter alia, over the known solution approaches. It is possible to realize three-value logic per memory cell using only two implantations. Therefore, for example, three bits can be stored in two cells. This saves a mask plane in comparison with the above-described method that is customary for MOSFETs. The programming does not take place until late in the process after the contact hole etching, which permits a favorable turnaround time. In the case of applications relevant to security, such as e.g. in the smart card field, subsequent read-out by backward preparation is possible only with difficulty.

Finally, no additional steps are necessary in the process sequence because many known overall processes have contact hole implantations in order to reduce the resistance of the contacts to diffusion region, to be precise particularly when titanium silicide or the like is not used. That makes the semiconductor memory device according to the invention and the method for fabricating it according to the invention highly cost-effective.

In accordance with one preferred development, the bit definition region is an implantation region that is located at the surface of the substrate region and serves for setting the contact resistance between the substrate region and the contact plug region. Thus, the contact resistance can be accurately set.

In accordance with a further preferred development, the bit definition region is an implantation region of a dopant of the first conductivity type. This corresponds to a doping on the surface region of the substrate, that is to say, to a decrease in the contact resistance.

In accordance with a further preferred development, the bit definition region is an implantation region of a dopant of a second conductivity type. This corresponds to a counterdoping of the surface region of the substrate, that is to say, to an increase in the contact resistance.

In accordance with a further preferred development, the bit definition region of the semiconductor memory elements corresponds to the substrate region. Thus, it is possible to establish a first state in accordance with a first bit without additional outlay.

In accordance with a further preferred development, the substrate has a further contact region located outside the bit definition region. The further contact region forms a terminal for a simple evaluation circuit, which is additionally connected to the contact plug region in order thus to determine the electrical resistance of the semiconductor memory element.

In accordance with a further preferred development, provision is made of an evaluation circuit device for evaluating the contact resistance of the respective semiconductor memory elements. As indicated above, the evaluation circuit may have a resistance measuring device, but may also operate capacitively or inductively.

With the foregoing and other objects in view there is further provided, in accordance with the invention, a method for fabricating the semiconductor memory device. The method includes the steps of:

a) providing a semiconductor substrate having a first conductivity type;

b) providing an insulating layer on the semiconductor substrate;

c) forming a matrix of contact holes down to the semiconductor substrate in the insulating layer in accordance with respective semiconductor memory elements;

d) providing a surface region of the semiconductor substrate situated underneath each of the contact holes with a contact resistance in accordance with a bit to be stored in a respective semiconductor memory element as a bit definition region of the respective semiconductor memory element, the contact resistance formed by the steps of:

d1) performing a first implantation with a dopant of the first conductivity type into a first group of the contact holes with remaining ones of the contact holes being masked;

d2) performing a second implantation with a dopant of a second conductivity type into a second group of the contact holes with remaining ones of the contact holes being masked; and d3) leaving the surface region of the semiconductor substrate situated underneath the respective contact holes in a substrate doping in a third group of contact holes;

e) providing contact plugs in the contact holes, the contact plugs being in electrical contact with the bit definition region; and f) providing a further contact region located in the semiconductor substrate outside the bit definition region.

Other features which are considered as characteristic for the invention are set forth in the appended claims.

Although the invention is illustrated and described herein as embodied in a semiconductor memory device and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of one fabrication step of a semiconductor memory element of a semiconductor memory device in accordance with an embodiment of the invention;

FIG. 2 is a sectional view of a further fabrication step of the semiconductor memory element of the semiconductor memory device in accordance with the embodiment.

DESCRIPTION OF THE PREFERRED EMBODIMENT

Figure 3:
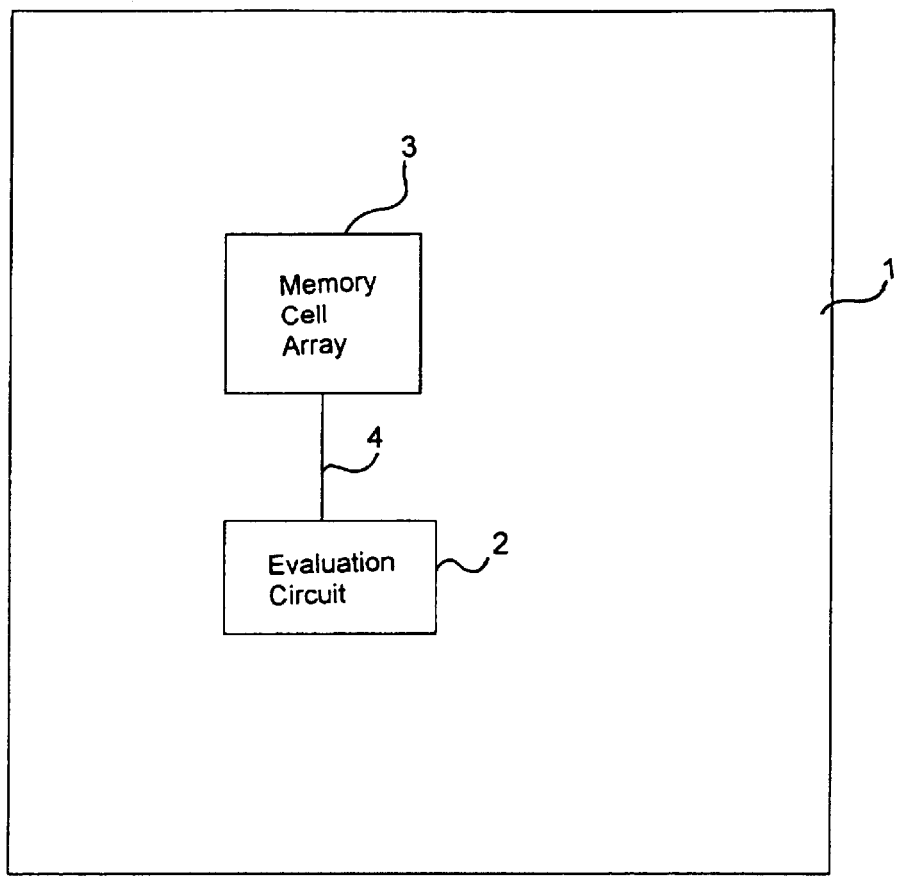
FIG. 3 is a block circuit diagram of the memory device connected to an evaluation circuit.

In all the figures of the drawing, sub-features and integral parts that correspond to one another bear the same reference symbol in each case. Referring now-to the figures of the drawing in detail and first, particularly, to FIG. 1 thereof, there is shown a semiconductor memory device 1 formed of a substrate 10, an insulating layer 20 disposed on the substrate 10, contact holes 25 formed in the insulating layer 20, bit definition regions 30, and an implantation $I_1$ and an implantation $I_2$.

The method for fabricating the semiconductor memory device 1 according to the invention in accordance with the embodiment proceeds as follows.

The substrate 10 having a first conductivity type (e.g. n-type silicon) is provided. In this case, the term substrate 10 is intended to be understood in the general sense, that is to say need not be the physical support but may also be an epitaxial layer situated thereon, a diffusion region provided therein, or the like.

Next, the insulating layer 20 is provided on the substrate 10, in which layer there is to be formed a matrix of contact holes 25 to the substrate 10 in accordance with respective semiconductor memory elements.

For programming the semiconductor memory elements thus defined, after the formation of the respective contact holes 25, that surface region of the substrate 10 which is situated underneath the contact holes 25 is provided with a respective contact resistance in accordance with a bit to be stored in the respective semiconductor memory element as bit definition region 30 of the relevant semiconductor memory element.

This is done as follows in the present example.

All the contact holes 25 are defined and etched free photolithographically. The first implantation $I_1$ into a first group of the contact holes 25 is then performed using a dopant of the first conductivity type n.

A second implantation $I_2$ is then performed using a dopant of a second conductivity type p in a second group of the contact holes 25.

A third group of the contact holes 25 remains covered by masks 32 during both implantations, that is to say does not receive implantation.

There are, then, the following semiconductor memory cells with increasing contact resistance: a contact implantation like the underlying substrate (e.g. like diffusion implantation), no implantation and contact implantation opposite to the underlying substrate.

Thus, it is possible to program three bits per two memory cells. Application in a three-value logic circuit device (ternary system) is also conceivable.

FIG. 2 is a schematic illustration of a further fabrication step of the semiconductor memory element of the semiconductor memory device 1 in accordance with the embodiment of the present invention.

In FIG. 2, in addition to the reference symbols already introduced, contact plugs 40 are provided.

After the programming of the respective semiconductor memory elements, the contact plugs 40 are provided in the contact holes 25, which are in electrical contact with the bit definition region 30.

The substrate 10 expediently has a strip-type conductor strip structure, e.g. polysilicon or diffusion strips, the strips each forming a second terminal of the memory cells on a top side of the substrate, which, in addition to the respective contact plug 40, forms a terminal 40' for an evaluation circuit with a resistance measuring device.

Although the present invention has been described above using preferred exemplary embodiments, it is not restricted thereto but rather can be modified in diverse ways.

In particular, further implantations can be carried out in order to produce semiconductor memory elements that can store even more logic values. Thus, the present invention makes it possible to fabricate a cost-effective multilevel ROM by application of the contact hole implantation(s), present in any case, for programming.

FIG. 3 shows a block circuit diagram of the semiconductor memory device 1 having the evaluation circuit 2 connected to an array of the memory cells 3. A bus 4 connects the evaluation circuit 2 to the memory cells 3 and the bus 4 is partially formed of the strip-type conductor strip structure running in the semiconductor substrate 10.

We claim:

1. A method for fabricating a semiconductor memory device, which comprises the steps of:
    providing a semiconductor substrate having a first conductivity type;
    providing an insulating layer on the semiconductor substrate;
    forming a matrix of contact holes down to the semiconductor substrate in the insulating layer in accordance with respective the semiconductor memory elements;
    providing a surface region of the semiconductor substrate situated underneath each of the contact holes with a contact resistance in accordance with a bit to be stored in a respective semiconductor memory element as a bit definition region of the respective semiconductor memory element, the contact resistance formed by the steps of:
        performing a first implantation with a dopant of the first conductivity type into a first group of the contact holes with remaining ones of the contact holes being masked;
        performing a second implantation with a dopant of a second conductivity type into a second group of the contact holes with remaining ones of the contact holes being masked; and
        leaving the surface region of the semiconductor substrate situated underneath the respective contact holes in a substrate doping in a third group of contact holes undoped;
    providing contact plugs in the contact holes, the contact plugs being in electrical contact with the bit definition region; and
    providing a further contact region located in the semiconductor substrate outside the bit definition region.

* * * * *